Aug. 26, 1958 H. W. REITZ 2,848,792

METHOD OF MAKING A WIRED CIRCUIT

Filed July 10, 1953 3 Sheets-Sheet 1

WITNESSES:

E. A. McCloskey

R. G. Brodahl

INVENTOR

Harold W. Reitz.

BY

F. E. Browder

ATTORNEY

Aug. 26, 1958 H. W. REITZ 2,848,792

METHOD OF MAKING A WIRED CIRCUIT

Filed July 10, 1953 3 Sheets-Sheet 2

WITNESSES:
E. A. McCloskey.
R. G. Brodahl

INVENTOR
Harold W. Reitz.
BY F. E. Browder
ATTORNEY

WITNESSES:
E. A. McCloskey.
K. G. Brodahl

INVENTOR
Harold W. Reitz.
BY
F. E. Browder
ATTORNEY

United States Patent Office 2,848,792

Patented Aug. 26, 1958

2,848,792

METHOD OF MAKING A WIRED CIRCUIT

Harold W. Reitz, Sunbury, Pa., assignor to Westinghouse Electric Corporation, East Pittsburgh, Pa., a corporation of Pennsylvania Application July 10, 1953, Serial No. 367,224

2 Claims. (Cl. 29—155.5)

The present invention relates to the manufacture and assembly of electrical apparatus, and more particularly to a simplified radio receiver apparatus and method of manufacture therefor.

It is an object of my invention to simplify the assembly and electrical wiring of electrical apparatus, such as a radio receiver or the like.

It is another object of my invention to save assembly time and labor in particularly the wiring operation of a complicated electrical apparatus involving electronic tubes and related radio components.

It is a further object of my invention to provide a radio chassis whereby continuous bare wire connections may be made between the various circuit components involved.

It is still another object of my invention to provide terminal fastening members as a part of the radio receiver chassis or base support member whereby the wiring operation thereof is assisted and the desired final lead or connection dress or condition is thereby obtainable.

It is a still further object of my invention to provide an improved electrical apparatus respecting the manufacture and maintenance thereof.

It is an additional object of my invention to reduce the manufacturing effort for an electrical apparatus such as a radio receiver by simplifying the manufacturing processes involved.

It is a still additional object of my invention to provide an improved electrical apparatus such as a radio receiver which apparatus incorporates an improved design which will enable the manufacture of an improved apparatus in less time and at a lower cost.

It is a further additional object of my invention to incorporate mass production manufacturing techniques and a simplified wiring of the component parts of an electrical apparatus such as a radio receiver.

The novel features of the invention, both as to its organization and method of operation together with additional objects and advantages thereof will best be understood from the following description of specific embodiments when read in conjunction with the accompanying drawings in which.

Figure 1:
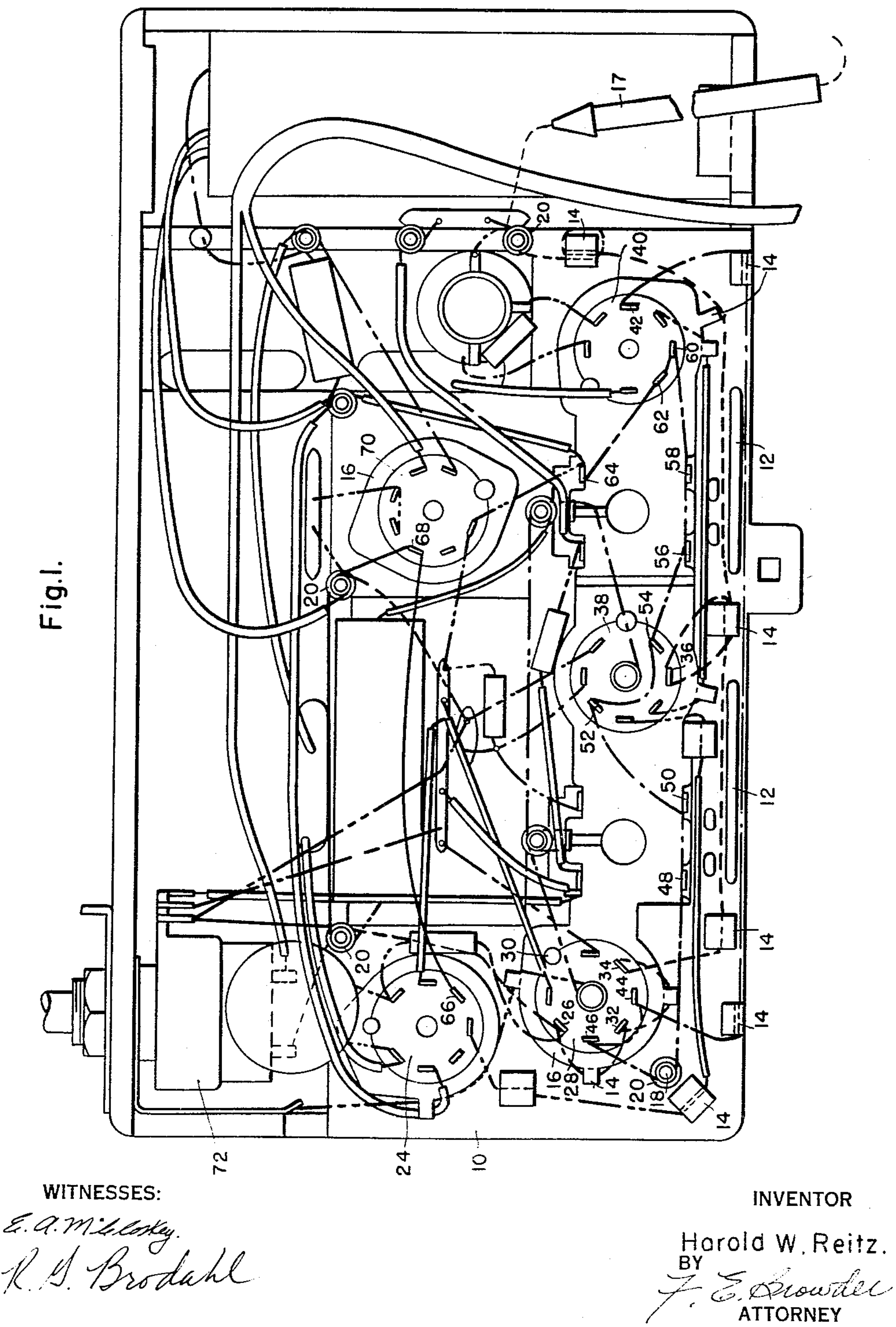
Figure 1 is a bottom view of a radio receiver in accordance with my invention.

In accordance with my invention I employ a chassis member 10 for the radio receiver, which chassis member is made of plastic or electrically insulating material and is preformed by molding or a like operation to include insulating fins 12, fastening lugs 14, integral tube sockets 16, or tube socket supports as desired, projection members 18 for supporting common tie terminals 20 and the like. Between the various tube socket terminals and the various connections to the circuit components of the radio receiver, continuous connection members or wires of electrically conductive material such as bare copper wire or the like are provided, with the integral molded insulating fins 12 of the radio chassis electrically insulating adjacent portions of said wire where necessary, and with lugs 14 or fastener members 18 projecting from the radio chassis where desirable to support the wire connection and provide the desired lead dress and wiring pattern. The tube sockets, and other circuit members such as the I. F. transformers, are provided with T-shaped terminals which terminals have a narrow body portion and a wider end portion and project away from the radio chassis member, as shown in particularly Fig. 2. Further provision is made of tie terminals 20 which comprise electrically conductive members that are positioned around projecting supports or fastener member 18 made of insulating material which supports project from the radio chassis 10. The tie terminals 20 and the above T-shaped terminals are used to hold the circuit connection wire in position for a subsequent dip soldering operation. The tie terminals 20 provide common electrical members to facilitate the wiring operation, and to provide electrical connections for the various circuit components, such as condensers, resistors, tuning coils, and the like.

Further in accordance with my invention a threading tool 17, as shown in Fig. 1, is employed to feed the continuous member of conductive material, such as the bare circuit wire, as the wire is sewn or wrapped around the various terminals and passed from terminal to terminal to complete the electrical circuit. The threading tool 17 may have incorporated as an integral component thereof a tension control device which may be manually controlled or automatic in operation. The threading tool 17 may be in the form of a pencil-like wire feed tool, with provision made for the wire member to be fed into one end and to be fed out of the opposite end to wrap around the terminals as shown.

A predetermined circuit wiring pattern is preferably followed from an initial starting point and subsequently throughout the various desired electrical connections to be made in the actual practice of my invention. However, I have determined from experience that for the particular radio receiver illustrated in the drawings three such starting positions should be employed to facilitate the wiring of the receiver and to minimize circuit connection crossovers and other circuit complexities. Nonetheless, I realize that the receiver could be wired with but a single starting point or position, or with more or less than the three starting points which I have selected to be employed and will describe.

In accordance with my invention, the wiring operation is initiated by wrapping the circuit wire around an initial terminal or fastening member at one of the preselected starting points. The wire is then passed to the next succeeding circuit terminal and passed around it, and subsequently to each succeeding terminal with the wire passing as desired along or around the molded lugs or projections of the plastic chassis member as necessary to mechanically secure the wire relative to the radio chassis member and to the respective terminals.

Also in accordance with my invention, I have chosen not to employ the continuous circuit connection member as herein described for every one of the electrical connections to be made in the radio receiver illustrated in the drawings, but instead have used the continuous circuit connection member for those connections which are to be subsequently dip soldered. Here again, this is but a matter of choice in practice, and in no way is a limitation of the teachings of my invention.

It has been found to be more practical to commonly connect the electrical circuit members to be subsequently soldered by dipping into a molten solder bath as illustrated more particularly in Fig. 1 and Fig. 2 by means of the continuous circuit connection members, and to complete the remainder of the necessary electrical connections for the illustrated radio receiver circuit by means of the leads which are available from the various circuit components employed or by means of separate electrical connections. The latter separate electrical connections are more particularly employed where it has been considered advisable to provide other than the bare wire members above described and as employed for the described continuous circuit connections. For the former separate electrical connections, insulated wire with a spaghetti or like covering of insulating material may be employed as is well known in the art. However, insulated wire connection members need not be employed for all of said separate electrical connections due to the presence of the chassis member made of plastic or other suitable insulating material.

Referring more particularly to Fig. 1 of the drawings, there is here illustrated a bottom view of a radio receiver as manufactured and assembled in accordance with my invention. The circuit for this radio receiver, as more particularly shown in Fig. 3, comprises a five tube type of radio receiver employing a 12BE6 converter tube, a 12BA6 I. F. amplifier tube, a 12AV6 combined second detector, automatic volume control and first audio amplifier tube as well known in the art. A 50C5 is employed as the power output stage, and a 35W4 rectifier tube is employed in the power supply of the receiver.

It should be noted that in the showing of Fig. 1, the continuous circuit connection members have been illustrated as wired from three separate starting points in the radio circuit, and the respective connection members or wires for each of these starting points have been shown in Fig. 1 by a dashed line, a dash-dot line, and a continuous line. The non-sewn or non-continuous circuit connections have been shown by a dash-with-two-dots line.

Referring more particularly to Fig. 1 of the drawings, wherein the tube sockets are shown from the underside of the receiver chassis and from the side away from the tubes, the connection made to the tie terminal 20 closest adjacent to the socket 24 of the 50C5 power output tube has been chosen as the first starting point for the first continuous circuit connection member of the receiver. The first continuous circuit connection member or circuit wire, illustrated in Fig. 1 by a dashed line representation, is wrapped around the tie terminal 20 at the first starting point as necessary to mechanically secure it at this position, and it is then passed to the left of the socket for the 50C5 power output tube, which latter socket physically projects from the base plane of the radio receiver chassis. The first wire member then passes to the sixth terminal pin 26 of the socket 28 of the 12AV6 tube which pin can be determined as the sixth by counting clockwise around the tube socket from the fastening member 30 which fastens this tube socket 28 to the radio chassis 10, which chassis and tube socket are made of electrically insulating material. The fastening member 30 may be in the form of a driven friction member which is securely positioned between the tube socket 28 and an opening therefore in the radio chassis 10, after the socket 28 has been positioned in said opening. The first continuous wire member then passes around a provided fastening member or lug 14, which is an integral part of the radio chassis member 10 but projects from the base plane of that chassis member adjacent the tube socket 28, and passes to the fourth terminal pin 32 of the same tube socket 28. The first continuous wire member then passes around another fastening member or lug 14, which is integral in the chassis member and adjacent tube socket 28, and passes to the second terminal pin 34 of the 12AV6 tube socket 28. The first continuous wire member then passes around another fastener member or lug 14 which is integral in the radio chassis 10 and passes on one side of a molded fin 12 or projecting member of insulating material which latter molded fin is an integral part of the radio chassis 10. The first continuous wire member then passes around a fourth fastener member 14 or projecting lug from the radio chassis 10 and passes to the second terminal pin 36 of the socket 38 for the 12BA6 I. F. amplifier tube. The first continuous wire member then passes from the second terminal pin 36 of the socket 36 of the 12BA6 tube, again around the last-mentioned fastener or lug member 14 and one side of another projecting molded fin 12 which is an integral part of the radio chassis 10, the wire then passes around an additional fastener or lug member 14 to be wrapped around still another fastener member 14 adjacent the socket 40 for the 12BE6 converter tube. From the last fastener member 14 the first continuous wire member passes to and is wrapped around a final tie terminal 20.

The second chosen starting point and the beginning of the second continuous wire member has been chosen as the third terminal pin 42 of the socket 40 for the 12BE6 converter tube. The second wire member passes from the latter terminal pin 42 around a provided fastener member 14 which projects from the base of the radio chassis 10 and along the opposite side of the nearest molded fin member 12 previously mentioned relative to the passage of the first continuous wire member. The second wire member then passes along the opposite side of the other molded fin 12 or projection member from the radio chassis 10 relative to the previously described passage on the opposite side thereof of the first wire member. The second wire member then passes around a provided support or fastener member 14 made of the same electrically insulated material as the radio chassis member 10. From the last mentioned fastener member 14, the second wire member passes to the third terminal pin 44 of the 12AV6 tube socket 28. From the latter terminal pin 44, the wire passes to the fifth terminal pin 46 of the 12AV6 tube, from which it passes around an adjacent provided tie terminal 20 to a first terminal 48 of the second I. F. transformer. From the first terminal 48 of this transformer, the second wire member then passes to a second terminal 50 of the same second I. F. transformer, from which it passes to the fifth terminal pin 52 of the socket 38 for the 12BA6 I. F. amplifier tube. From the fifth terminal pin 52 of this tube socket 38, the second wire member passes to the first terminal pin 54 for the same tube socket 38 and subsequently passes to a first terminal 56 of the first I. F. transformer member. The second wire member then passes to a second terminal 58 of the first I. F. transformer, and subsequently to the fifth terminal pin 60 of the tube socket 40 for the 12BE6 converter tube. Subsequently, the second wire member passes to the sixth terminal pin 62 for the same tube socket 40 and then to a third terminal 64 of the first I. F. transformer which is the ending point for the second wire member.

The starting point for the third continuous wire member in the circuit wiring pattern as illustrated particularly in Fig. 1 has been chosen as the third terminal pin 66 of the socket 24 for the 50C5 output power tube. The third continuous wire member, which is shown as a continuous or solid line in Fig. 1, passes from this third terminal pin 66 of the 50C5 output tube socket 24 to the third terminal pin 68 of the 35W4 rectifier tube socket 70, and then to a provided tie terminal 20 adjacent the tube socket 70 of the 35W4 rectifier tube. From the latter tie terminal 20, the third tie member passes to a still additional tie terminal 20 adjacent the socket 24 of the 50C5 output tube, and is subsequently passed to one end of the volume control resistor 72 which is the ending point for the third continuous wire member.

Where the continuous circuit connection members are to be electrically connected to each of the tube socket terminal pins, the provided tie terminals and the like, the continuous circuit connection member is physically wrapped around the respective terminal pins or tie terminals to provide a better mechanical fastening at this position and to thereby later facilitate the soldering operation of the respective electrical connections.

It is to be understood that additional circuit portions of the illustrated radio receiver could be sew wired, by this I mean wired by means of a continuous circuit connection member which is passed as shown between various electrical connections to be made. For example, the whole radio circuit could be sew wired, with those connections which are to be later dip soldered or soldered by physically dipping into a solder bath being positioned in a substantially common plane and the remainder of the electrical connections could be manually soldered or soldered by some other suitable means.

Accordingly, for an electrical circuit which could feasibly and most simply be wired by means of a continuous circuit connection member being employed to make all of the necessary electrical connections, this could be readily accomplished in accordance with my invention and the complete circuit dip soldered in a single operation or even in a plurality of predetermined operations or a predetermined portion of that circuit could be dip soldered and the remainder soldered by hand or by other suitable soldering means.

Also in accordance with my invention, the terminal pins for the tube sockets have been T-shaped or shaped such that they have a relatively narrow body portion and a wider end portion. The T-shape of the terminals is provided to facilitate the mechanical fastening of the continuous connection member by a wrap around operation such that the circuit connection member can be physically wrapped around the narrow portion of the T-shaped terminal pin and held in such position by the wider end portion of that terminal pin. The tie terminals may be similarly T-shaped in accordance with my invention as desired in actual practice. In the actual wiring of the particular radio receiver illustrated in the drawings, and which I have chosen as an example of the practice of my invention, the first and second I. F. transformer terminals have been T-shaped similar to the tube socket terminal pins.

The remainder of the radio circuit other than the above-described portions which have been electrically interconnected by means of the continuous circuit connection members, which I have described, can be wired together in the conventional prior art manner of construction namely by fastening the leads of these various components to the desired electrical connection points and manually soldering the latter connection points or soldering these connection points by means of the subsequent dip soldering operation.

Figure 2:
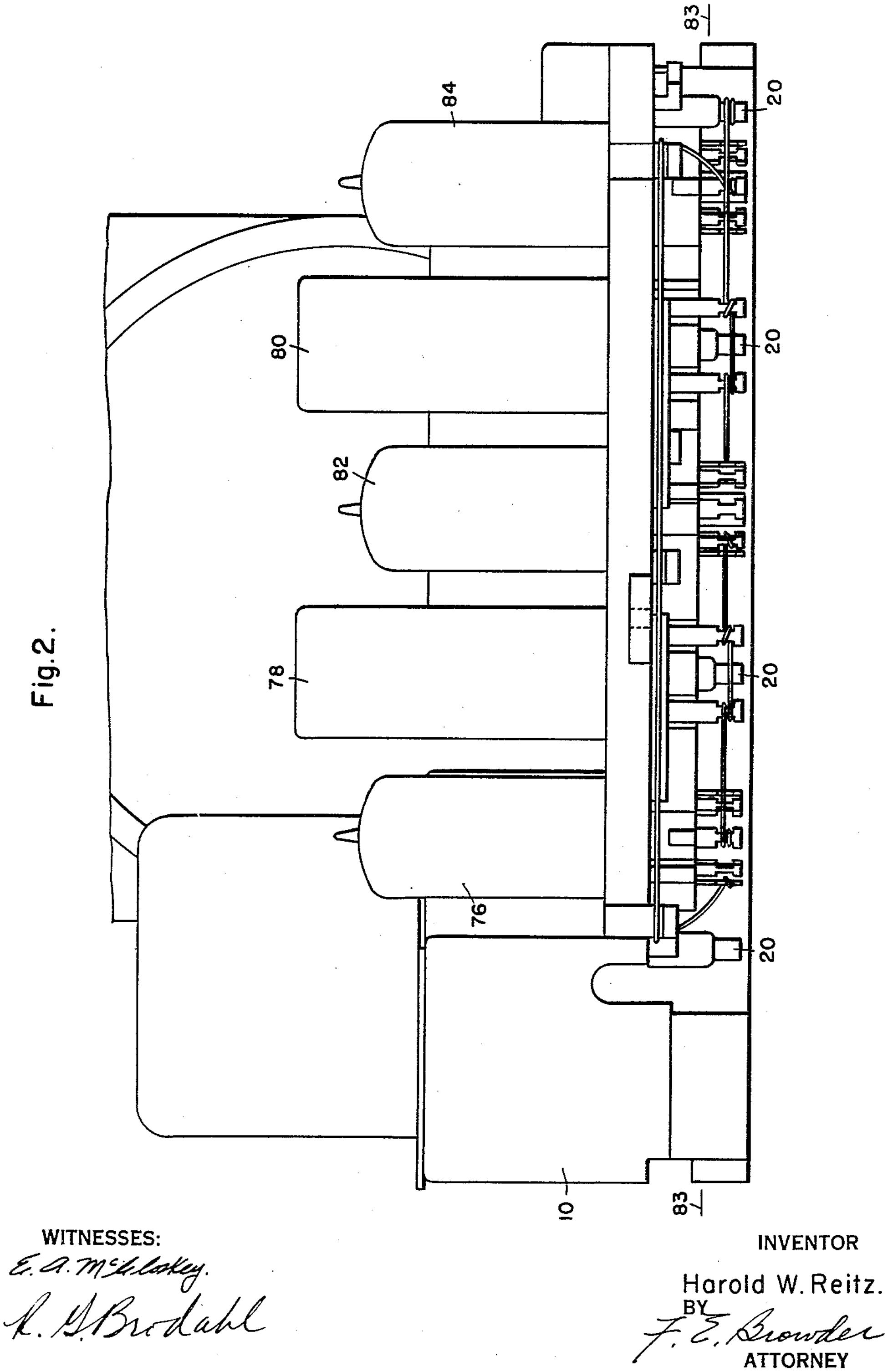
Fig. 2 is a side view of the same radio receiver.

In Fig. 2 of the drawings I have shown a side view of the radio chassis shown in Fig. 1 which side view illustrates the position of the 12BE6 converter tube 76, the first I. F. transformer can 78 and the second I. F. transformer can or shield 80, the 12BA6 I. F. amplifier tube 82 and 12AV6 combined second detector, automatic volume control and audio amplifier tube 84. It will be noted from particularly Fig. 2 that the respective tube socket terminal pins and the connections for the first and second I. F. transformers are provided with a T-shape such that the respective wires or connection members can be physically wrapped around the relatively narrow portion of this T-shaped terminal to physically hold the respective connections for a subsequent soldering operation. Also shown in Fig. 2 is the solder bath level indication 83, which shows the level of the molten solder employed in the dip soldering operation as described herein and understood by those skilled in this art.

Figure 3:
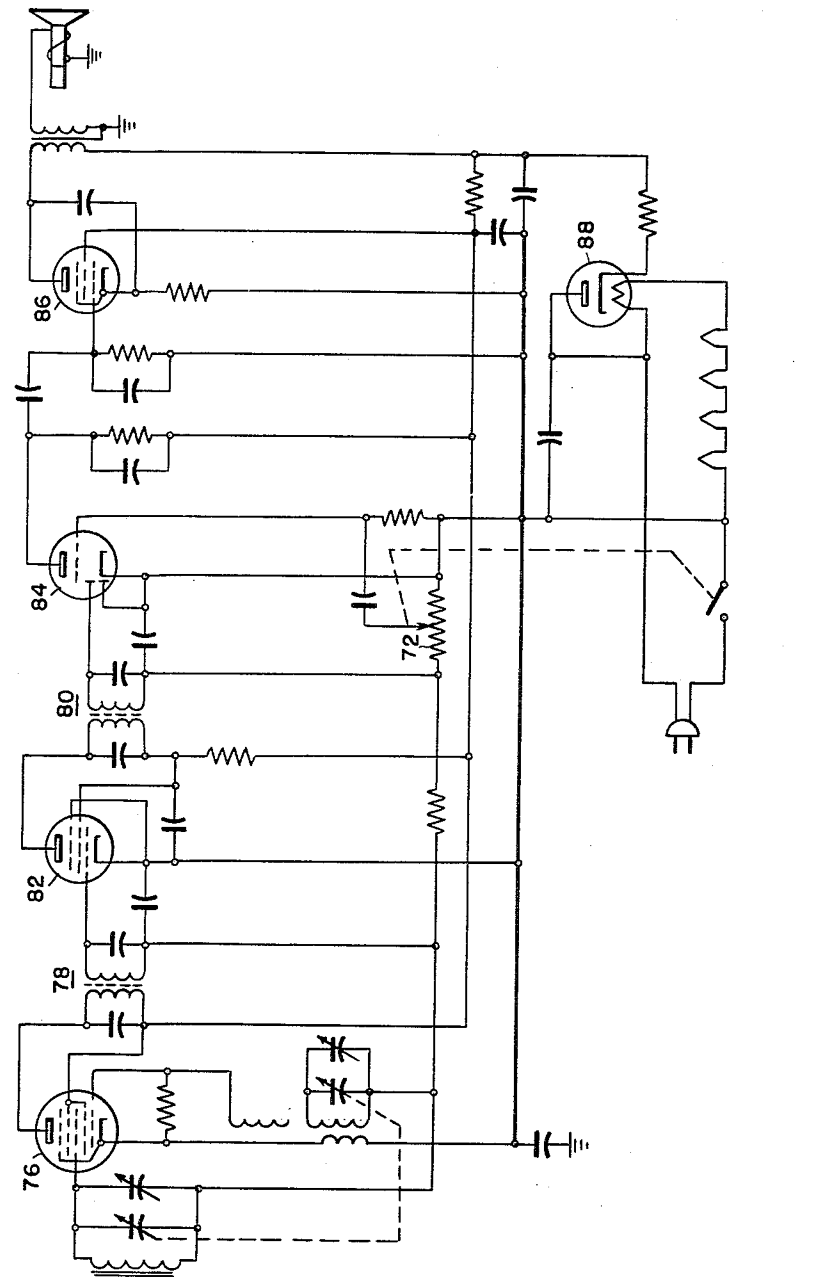
Fig. 3 is a schematic diagram of the electrical circuit of the radio receiver shown in Figs. 1 and 2.

In Fig. 3 there is shown an electrical schematic diagram for the circuit of the illustrated radio receiver showing the various connections between the tubes and other circuit components of the circuit for the radio receiver illustrated in Figs. 1 and 2.

Diagrammatic showings are made in Fig. 3 for the 12BE6 converter tube 76, the 12BA6 intermediate frequency amplifier tube 82, the 12AU6 combined second detector, automatic volume control and audio amplifier tube 84, the 50C5 output power amplifier tube 86 and the 35W4 rectifier tube 88 in the power supply for the illustrated radio receiver. The volume control resistor 72 is shown, and the respective first and second I. F. transformers 78 and 80.

In accordance with my invention, after the continuous wire members are sewed together, the respective tube socket terminal pins and other electrical connections to be made, and after the various other circuit components have been connected into the circuit, the radio chassis 10 is physically dipped into a bath of molten solder. All of the terminals which are to be dip soldered physically project at their connection ends from the radio chassis to end or terminate into a substantially common plane, such that the soldering operation at the terminal ends may be done simultaneously to all of these terminals by a single immersion operation into the bath of molten solder. In this respect, the radio chassis may be physically lowered into the solder bath or the solder bath may be raised for the same purpose. If desired, the bath can be specially shaped to avoid soldering any portions of the radio chassis which are in the plane of the solder bath but are preferably not to be soldered by that bath.

After the dip soldering operation those electrical connections which are not in the abovedescribed common plane are manually soldered or soldered by some other suitable operation such that all electrical connections as desired and which are to be made are securely soldered to provide the desired electrical circuit connection at these points.

After the soldering operation is completed, predetermined portions of the sew wired circuit must be removed in that these latter portions effectively short circuit the respective electrical connections between which they are connected. In the arrangement illustrated particularly in Fig. 1 of applicant's drawings, the first continuous circuit connection member contains no such undesired short circuiting connections. However, the second continuous circuit connection member contains such as undesired short circuiting section between the third and fifth terminal pins 44 and 46 of the 12AV6 tube socket 28. The second connection member contains another undesired short circuiting connection between the first and second terminals 48 and 50 of the second I. F. transformer. This same circuit connection member contains another undesired short circuiting section between the fifth and first terminal pins 54 and 52 of the 12BA6 I. F. amplifier tube socket 38, and another such undesired short circuit section between the first and second terminal connections 56 and 58 made to the first I. F. transformer, and a final undesired short circuiting connection between the fifth and sixth terminal pins 60 and 62 of the 12BE6 converter tube socket 40. All of these undesired short circuited connections are physically removed by clipping or removing them from the circuit after the soldering operation for the circuit is completed. The third continuous circuit connection member as illustrated in particularly Fig. 1 of applicant's drawings contains an undesired short circuiting section between the third terminal pin 68 of the 35W4 rectifier tube socket and the illustrated circuit connection which the third continuous circuit connection member makes to the closest adjacent tie terminal 20 and subsequently to one end of the volume control resistor 72.

After the undesired short circuiting connections have been removed from the circuit, the radio receiver, in accordance with my invention as illustrated in the drawings, is operable and ready for use.

While I have described my invention in one of its preferred forms, it is obviously subject to wide ramifications and modifications and is applicable to other types of electrical apparatus other than the illustrated radio receiver circuit.

In this respect, the continuous circuit connection members or wires in accordance with my invention may be bare and uninsulated wires or members, or they may be insulated or covered with an insulating material. In the latter case, it is understood that suitable circuit connections are to be provided where the wire members are fastened to or wrapped around the various terminals and the like. Also, it should be noted that other suitable means for temporarily holding the circuit connection members relative to the various terminals prior to soldering may be used, since the subsequent solder understandably provides physical support for these connections.

Further in accordance with my invention, the threading tool 17 as shown in Fig. 1 may take the form of a more complicated apparatus with provision for wire member storage if desired, and it may be made automatic in operation and include a tension controlled power feed for the wire member if desired.

I claim as my invention:

1. In a method of wiring an electrical apparatus, said apparatus including an electrical component chassis member made of insulating material and having a plurality of terminal members made of electrically conductive material projecting from said chassis member and lying in a single plane and having a plurality of insulating material projections lying outside said plane projecting from said chassis member, with predetermined terminal members to be electrically connected to form a plurality of separate electrical circuits having points of crossover, the steps of extending a continuous wire member of electrically conductive material from a first terminal member of said plurality to a second terminal member of said plurality and securing said wire member to said terminal members, thereafter extending said wire member from said second terminal member to a third terminal member and subsequently to at least a fourth terminal member, physically dipping said chassis member into a molten solder bath to immerse the projecting portions of a plurality of said terminals so that said wire member is soldered to a plurality of said terminals, and thereafter removing predetermined portions of said wire member which constitute undesired electrical paths between certain pairs of said terminal members, with the remaining portions of said wire member lying in different planes at points of crossover.

2. In a method of wiring an electrical apparatus, said apparatus including an electrical component chassis member made of insulating material and having a plurality of terminal members made of electrically conductive material projecting from said chassis member and lying in a single plane and having a plurality of insulating material projections projecting from said chassis member and lying outside said plane, with predetermined terminal members to be electrically connected to form a plurality of separate electrical circuits having points of circuit crossover, the steps of extending a continuous wire member of electrically conductive material from a first terminal member of said plurality to a second terminal member of said plurality and securing said wire member to said terminal members, thereafter extending said wire member from said second terminal member to a third terminal member and subsequently to at least a fourth terminal member with said wire member being passed around said insulating material projections as said wire member passes between predetermined pairs of said terminal members, physically dipping said chassis member into a molten solder bath to immerse the projecting portions of a plurality of said terminals so that said wire member is soldered to a plurality of said terminals, and thereafter removing predetermined portions of said wire member which constitute undesired electrical paths between certain pairs of said terminal members with the remaining portions of said wire member lying in different planes at points of circuit crossover.

References Cited in the file of this patent

UNITED STATES PATENTS

| | | |
|---|---|---|
| 905,045 | Ayer et al. | Nov. 24, 1908 |
| 2,214,151 | Wagar | Sept. 10, 1940 |
| 2,420,754 | MacFadden | May 20, 1947 |
| 2,525,449 | Coutant | Oct. 10, 1950 |
| 2,713,194 | Roach | July 19, 1955 |
| 2,740,193 | Pessel | Apr. 3, 1956 |

FOREIGN PATENTS

| | | |
|---|---|---|
| 226,895 | Great Britain | Jan. 6, 1925 |
| 661,989 | Great Britain | Nov. 28, 1951 |